United States Patent [19]
Yabe

[11] Patent Number: 5,212,651
[45] Date of Patent: May 18, 1993

[54] SCAN PATH GENERATION WITH FLIP-FLOP REARRANGEMENT ACCORDING TO GEOMETRY OF LOGIC CIRCUIT

[75] Inventor: Shoji Yabe, Tokyo, Japan

[73] Assignee: NEC Corporation, Tokyo, Japan

[21] Appl. No.: 492,021

[22] Filed: Mar. 12, 1990

[30] Foreign Application Priority Data

Mar. 10, 1989 [JP] Japan .................................. 1-59260

[51] Int. Cl.[5] ............................................ G06F 15/60
[52] U.S. Cl. ................................. 364/488; 371/22.1; 364/489
[58] Field of Search ............................... 364/488–491; 371/22.3, 23

[56] References Cited

U.S. PATENT DOCUMENTS

| | | | |
|---|---|---|---|
| 4,534,028 | 8/1985 | Trischler | 371/22.3 |
| 4,613,940 | 9/1986 | Shenton et al. | 364/488 X |
| 4,630,219 | 12/1986 | Di Giacomo et al. | 364/488 X |
| 4,752,887 | 6/1988 | Kuwahara | 364/491 |
| 4,754,408 | 6/1988 | Carpenter et al. | 364/491 |
| 4,801,870 | 1/1989 | Eichelberger et al. | 371/22.3 |
| 4,823,276 | 4/1989 | Hiwatashi | 364/488 X |
| 4,879,718 | 11/1989 | Sanner | 371/22.3 |
| 4,947,357 | 8/1990 | Stewart et al. | 371/22.3 |
| 5,036,473 | 7/1991 | Butts et al. | 371/23 |

OTHER PUBLICATIONS

Trischler, E. "Incomplete Scan Path with an Automatic Test Generation Methodology", IEEE Digest of Papers, 1980 Test Conference (pp. 153–163) reprinted as pp. 263–272, 1980.

*Primary Examiner*—Joseph L. Dixon
*Attorney, Agent, or Firm*—Sughrue, Mion, Zinn, Macpeak & Seas

[57] ABSTRACT

In a scan path generation system, flip-flops and logic elements of a logic circuit are placed on an X-Y plane according to logical connection data and original scan path data. Data describing a sequence in which the flip-flops are to be arranged for the benefit of the geometry of the logic circuit is prepared and stored in a sequence table. The flip-flops on the X-Y plane are rearranged according to the data stored in the sequence table. New scan path data is derived from the rearranged flip-flops and are substituted for the original scan path data to be used for connecting the flip-flops. Due to the rearrangement process, the flip-flops can be connected in a scan path with relatively short and straight path sections between successive flip-flops, minimizing the amount of channel space which is occupied by the scan path.

11 Claims, 4 Drawing Sheets

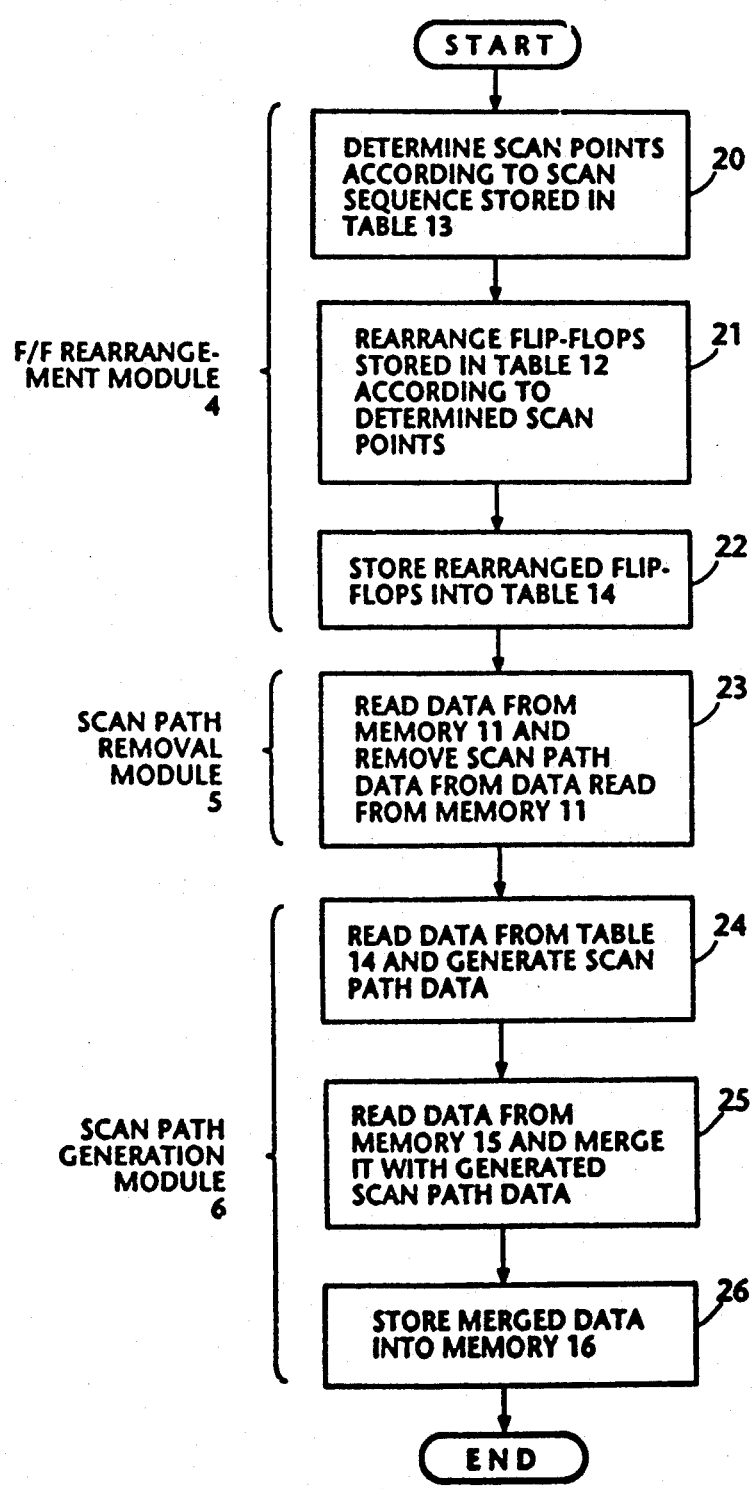

FIG. 3
SCAN PATH DATA IN MEMORY 11

| FROM | TO |
|---|---|
| INPUT | FLIP-FLOP A |
| FLIP-FLOP A | FLIP-FLOP B |
| FLIP-FLOP B | FLIP-FLOP C |
| FLIP-FLOP C | FLIP-FLOP D |
| FLIP-FLOP D | FLIP-FLOP E |
| FLIP-FLOP E | OUTPUT |

FIG. 4
F/F PLACEMENT DATA IN TABLE 12

|  | X | Y |
|---|---|---|
| FLIP-FLOP A | 2 | 2 |
| FLIP-FLOP B | 10 | 1 |
| FLIP-FLOP C | 12 | 2 |
| FLIP-FLOP D | 8 | 2 |
| FLIP-FLOP E | 5 | 1 |

FIG. 5
SCAN SEQUENCE IN TABLE 13

| X | Y |  |
|---|---|---|
| 1 | 2 |  |
| 2 | 2 | A |
| 3 | 2 |  |
| ⋮ | ⋮ |  |
| 8 | 2 | D |
| ⋮ | ⋮ |  |
| 11 | 2 |  |
| 12 | 2 | C |
| 1 | 1 |  |
| 2 | 1 |  |
| ⋮ | ⋮ |  |
| 5 | 1 | E |
| ⋮ | ⋮ |  |
| 10 | 1 | B |
| 11 | 1 |  |
| 12 | 1 |  |

SEQUENCE →

FIG. 6
REARRANGEMENT DATA IN TABLE 14

FLIP-FLOP A
FLIP-FLOP D
FLIP-FLOP C
FLIP-FLOP E
FLIP-FLOP B

SEQUENCE →

FIG. 7

| FROM | TO |
|---|---|
| INPUT | FLIP-FLOP A |
| FLIP-FLOP A | FLIP-FLOP D |
| FLIP-FLOP D | FLIP-FLOP C |
| FLIP-FLOP C | FLIP-FLOP E |
| FLIP-FLOP E | FLIP-FLOP B |
| FLIP-FLOP B | OUTPUT |

ORIGINAL SCAN PATH

NEW SCAN PATH

SCAN PATH GENERATION WITH FLIP-FLOP REARRANGEMENT ACCORDING TO GEOMETRY OF LOGIC CIRCUIT

TECHNICAL FIELD

The present invention relates to automatic placement and connection of flip-flops along a scan path in an LSI (large scale integration) logic circuit for locating an error in the circuit by applying a read pulse along the scan path during a test mode.

BACKGROUND OF THE INVENTION

It is known in the LSI technology to place flip-flops in a logic circuit so that they are triggered into a set condition in response to an error bit that occurs in the logic circuit during normal circuit operations. During a test mode, the flip-flops are brought into a series circuit, or scan path, and a read pulse is applied along the scan path to read out the contents of the flip-flops into a diagnostic circuit to determine the location of the error. Scan path connection is determined at the stage of logic circuit design in order to allow computer simulations to be performed on the whole circuitry including the scan path. No alterations are made on the flip-flops during a later stage of design in which the placement and wiring of logic elements are determined. The placement or logic elements, on the other hand, is made according to a connecting algorithm so that individual logic elements to be connected are not spaced far apart from each other. In addition to the scan-path connection, a number of other connections are necessary for the scan-path flip-flops. Because of the geometric design requirements of a particular logic circuit, the sequence in which the flip-flops are arranged is not necessarily optimum for the wiring pattern of the logic elements. Under such circumstances, some logic elements located far apart from each other must be wired together. However, it involves a long meandering path which reduces the amount of channel space dedicated for other circuit connections.

SUMMARY OF THE INVENTION

It is therefore an object of the present invention to provide a scan path generation system and method which eliminates scan paths which follow a long, wandering course.

According to the present invention, there is provided a scan path generation system for connecting a plurality of flip-flops of a logic circuit along a scan path. The system comprises a placement module for placing the flip-flops and logic elements of the logic circuit on a two-dimensional plane according to logical connection data and original scan path data stored in a memory. A sequence of flip-flops is prepared to meet the geometrical design requirement of the logic circuit and data representing that sequence is stored in a sequence table. A rearrangement module is provided for rearranging the flip-flops placed on the two-dimensional plane according to the sequence stored in the sequence table. New scan path data is derived by a scan path generation module from the rearranged flip-flops and are substituted for the original scan path data.

Specifically, the flip-flops are mapped on an X-Y coordinate plane according to the original scan path data, and the rearrangement is made according to relationships between sequentially arranged values on X coordinate of the plane and sequentially arranged values on the Y coordinate of the plane.

Since the flip-flops are rearranged according to the design requirement of a particular logic circuit, they are connected in a scan path having sections which are relatively short and straight between successive flip-flops, minimizing the space occupied by the scan path.

BRIEF DESCRIPTION OF THE DRAWINGS

The present invention will be described in further detail with reference to the accompanying drawings, in which:

FIG. 2 is a flowchart describing steps to be performed by the rearrangement module, scan path removal module and scan path generation module of FIG. 1;

FIGS. 3 and 4 are illustrations of stored original flip-flop sequence data and stored flip-flop location data, respectively;

FIG. 5 is an illustration of sequence data mapped in the scan sequence table of FIG. 1;

FIGS. 6 and 7 are illustrations of rearranged flip-flop sequence data and new scan path data;

DETAILED DESCRIPTION

Figure 1:
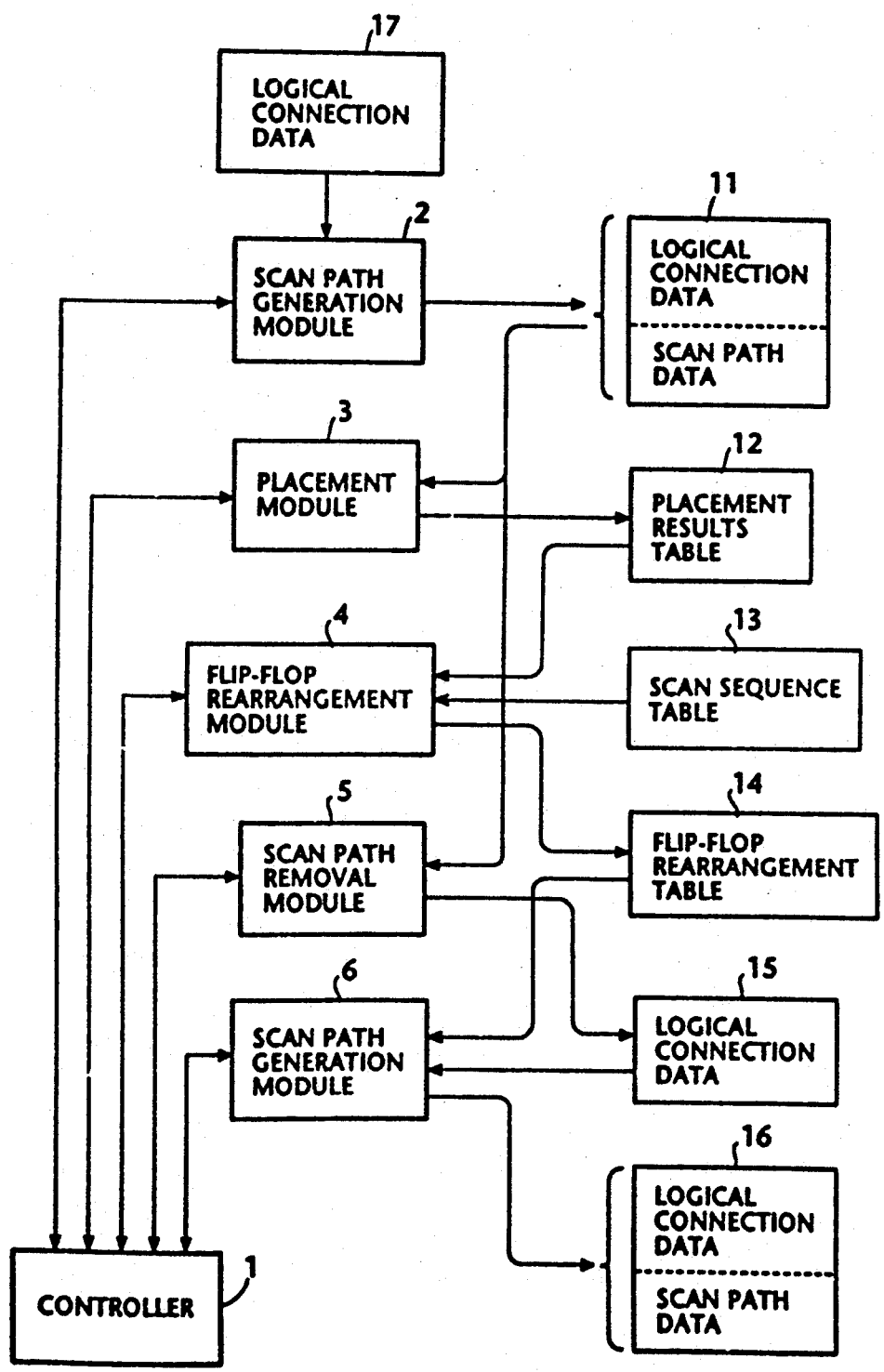
FIG. 1 is a block diagram of a scan path generation system of this invention.

Referring now to FIG. 1, there is shown a scan path generation system according to this invention. The system generally comprises a plurality of modules 2~6, a plurality of memories and tables 11~17, and a controller 1 which provides sequential timing control for the modules 2~6.

Original logical connection data is stored in memory 17 which is loaded into the scan path generation module 2 in response to a first timing signal supplied from the controller 1. The original logical connection data includes information on the connections of logic elements, the description of the gate arrays and flip-flops with scan function. However, no scan-path information is included. Scan path generation module 2 randomly selects the flip-flops contained in the descriptions of the loaded data and generates a scan path in which the selected flip-flops are connected in series in a manner known in the art. Data on the generated scan path is merged with the logical connection data and stored into memory 11. Storage of the original logical connection data including scan-path data permits computer simulations to be performed on the whole logic circuitry including a scan path for verification purposes. On completing a task, scan path generation module 2 returns a signal to the controller 1, whereupon it sends a second timing signal to the placement module 3 of a known design.

On receiving the timing signal, placement module 3 retrieves data from memory 11 and determines the locations of logic elements and flip-flops in accordance with the retrieved logical connection data and scan path data. The results of the placement of logic elements and scan-path flip-flops are stored into placement results table 12 and a signal is returned to the controller 1, allowing it to apply a third timing signal to a flip-flop rearrangement module 4.

In response to the third timing signal, the flip-flop rearrangement module 4 retrieves stored data from the placement results table 12 and sequence data from a scan sequence table 13. This scan sequence table describes a sequence in which scan-path flip-flops are to be traced from the design viewpoint of an LSI or a printed wiring board.

As shown in detail in FIG. 2 in flowchart form, flip-flop rearrangement module 4 determines scan points according to the retrieved scan sequence data (step 20) and exits to step 21 to rearrange the flip-flops retrieved from table 12 by tracing them according to the determined scan points.

For a better understanding of the present invention, reference is made briefly to FIGS. 3 to 5. Assume that exemplary scan-path flip-flops A, B, C, D and E are mapped in memory 11 in the order named, as shown in FIG. 3 so that the beginning of a scan path is at the input of flip-flop A and the end of the scan path is at the output of flip-flop E. FIG. 4 shows the X-Y locations of the flip-flops A to E which are mapped in placement results table 12. For example, flip-flops A to E are located on positions defined by X-Y coordinates (2, 2), (10, 1), (12, 2), (8, 2) and (5, 1), respectively. If the design principle or geometrical requirement of an LSI or a printed wiring board dictates a particular sequence, this sequence is mapped in terms of X and Y coordinates in a manner as shown in FIG. 5.

According to the sequence data shown in FIG. 5, F/F rearrangement module 4 determines the scan points. Therefore, the first scan point goes to flip-flop A, the second scan point goes to flip-flop D, the third to flip-flop C, the fourth to flip-flop E, and the last to flip-flop B. According to the sequence of these scan points, the flip-flops are traced and rearranged as marked on the right side of the table of FIG. 5.

Returning to FIG. 2, data describing the rearranged scan-path flip-flops is prepared and stored into a flip-flop rearrangement table 14 (step 22), which will appear as shown in FIG. 6.

On completing a task, F/F rearrangement module 4 returns a signal to the controller 1, whereupon it sends a fourth timing signal to a scan path removal module 5, FIG. 1. On receiving this timing signal, scan path removal module 5 retrieves all data from memory 11, removes the scan path data from it, leaving the logical connection data, and stores the latter into a memory 15 (step 23, FIG. 2). When this occurs, a signal is returned from module 5 to the controller 1 to permit it to send a fifth timing signal to a scan path generation module 6 which comprises steps 24 to 26, FIG. 2. In step 24, module 6 retrieves data from flip-flop rearrangement table 14 and derives from it a scan path, which may be mapped for the flip-flops A to E of FIG. 6 in a manner as shown in FIG. 7. The logical connection data is then retrieved from memory 15 (step 25) and merged with the scan path data, the merged data being stored into a memory 16 (step 26).

Figure 8A:
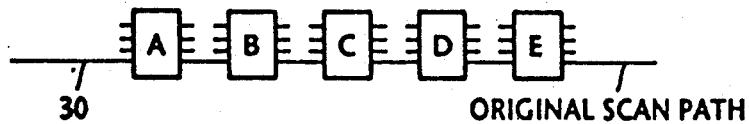
FIGS. 8a and 8b are illustrations of flip-flops connected in an original scan path and a connection of those located on an X-Y plane if the original scan path data is used.
Figure 8B:
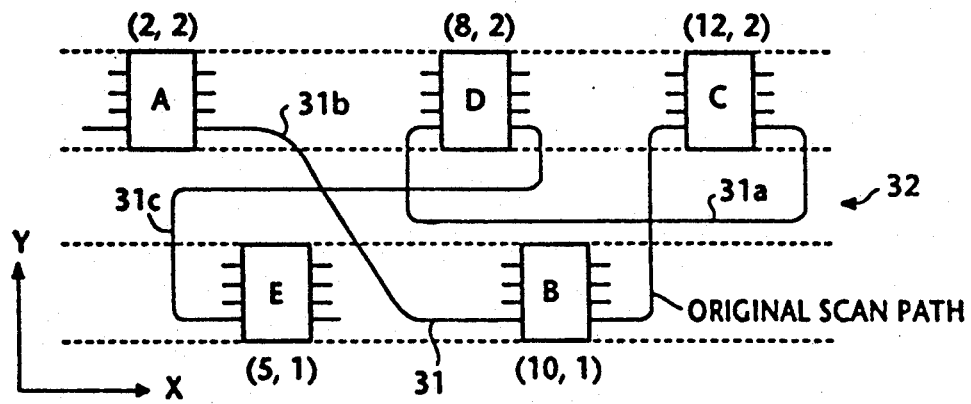

Using the same examples as those in FIGS. 3 to 7, the original scan path derived by module 2 would appear as a connection 30 shown in FIG. 8a and would otherwise result in a connection 31 which follows a winding course as shown in FIG. 8b if the original scan path data stored in memory 11 is used instead of the scan path data stored in memory 16. Since each scan-path flip-flop is provided with connecting pins other than the scan path pins as illustrated, section 31a, 31b and 31c of the winding scan path 31 may deprive the channel space 32 of its substantial portion which may be reserved for other connections.

Figure 9A:
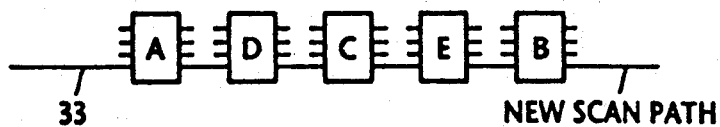
FIGS. 9a and 9b are illustrations of flip-flops connected in a new scan path and a connection of those located on an X-Y plane if the new scan path data is used, instead of the original scan path data.
Figure 9B:
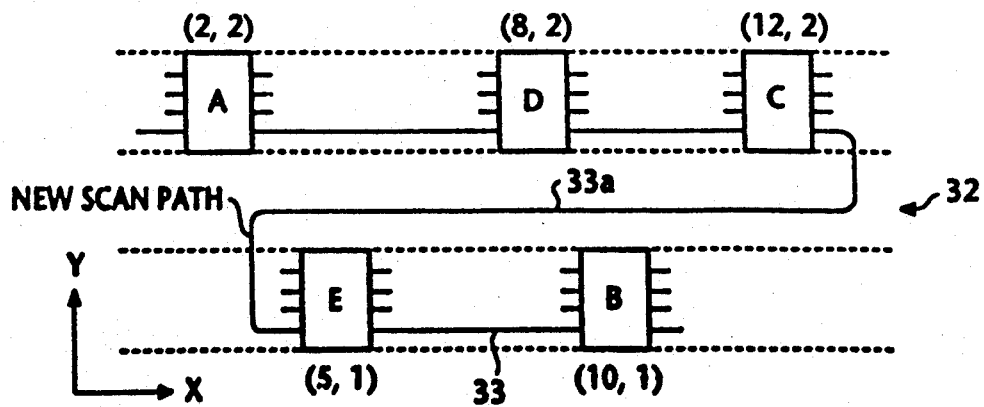

The scan path data stored in memory 16 is represented by a connection 33 in FIG. 9a. According to the present invention, this scan path data is used for creating a connection, which will follow a relatively straight path through flip-flops A to E arranged on the logic circuit. It is seen from FIG. 9b that only one straight section 33a occurs in the created scan path that occupies a small portion of the channel space 32.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A scan path generation system for arranging a plurality of flip-flops of a logic circuit along a scan path, comprising:
   placement means for placing said flip-flops and logic elements of said logic circuit on a two-dimensional plane according to logical connection data and original scan path data stored in a memory;
   memory means for storing a sequence of said flip-flops which meets geometrical design requirements of said logic circuit;
   rearrangement means for rearranging said flip-flops placed on said two-dimensional plane according to said sequence; and
   scan path generation means for deriving new scan path data from said rearranged flip-flops and replacing said original scan path data in said memory with said new scan path data.

2. A scan path generation system as claimed in claim 1, wherein said flip-flops placed on said two-dimensional plane are represented by a map describing relationships between said flip-flops and a corresponding set of X-Y coordinate values of said plane.

3. A scan path generation system as claimed in claim 1, wherein said sequence stored in said memory means is represented by a map describing relationships between sequentially arranged values on an X coordinate of said two-dimensional plane and sequentially arranged values on a Y coordinate of said plane.

4. A scan path generation system for arranging a plurality of flip-flops of a logic circuit along a scan path, comprising:
   first scan path generation means for generating original scan path data which represents a sequence according to which said flip-flops would originally be connected in said scan path;
   placement means for placing said flip-flops on a two-dimensional plane according to said original scan path data;
   memory means for storing a sequence of said flip-flops which meets geometrical design requirements of said logic circuit;
   rearrangement means for rearranging said flip-flops placed on said two-dimensional plane according to said sequence stored in said memory means; and
   second scan path generation means for deriving from said rearranged flip-flops new scan path data representative of a new sequence according to which said flip-flops are to be newly connected in said scan path and replacing said original scan path data with said new scan path data.

5. A scan path generation system as claimed in claim 4, wherein said flip-flops placed on said two-dimensional plane are represented by a map describing relationships between said flip-flops and a corresponding set of X-Y coordinate values of said plane.

6. A scan path generation system as claimed in claim 4, wherein said sequence stored in said memory means is represented by a map describing relationships between sequentially arranged values on an X coordinate of said two-dimensional plane and sequentially arranged values on a Y coordinate of said plane.

7. A scan path generation system for arranging a plurality of flip-flops of a logic circuit along a scan path, comprising:
    first scan path generation means for deriving from logical connection data original scan path data which represents a sequence according to which said flip-flops would originally be connected in said scan path;
    storage means for storing said original scan path data and said logical connection data;
    placement means for placing said flip-flops and logic elements of said logic circuit on a two-dimensional plane according to said original scan path data and to said logical connection data stored in said storage means;
    table memory means for storing a sequence of said flip-flops which meets geometrical design requirements of said logic circuit;
    rearrangement means for rearranging said flip-flops placed on said two-dimensional plane according to said sequence stored in said table memory means; and
    second scan path generation means for deriving from said rearranged flip-flops new scan path data representative of a new sequence according to which said flip-flops are to be newly connected in said scan path and replacing said original scan path data stored in said storage means with said new scan path data.

8. A scan path generation system as claimed in claim 7, wherein said flip-flops placed on said two-dimensional plane are represented by a map describing relationships between said flip-flops and a corresponding set of X-Y coordinate values of said plane.

9. A scan path generation system as claimed in claim 7, wherein said sequence stored in said memory means is represented by a map describing relationships between sequentially arranged values on an X coordinate of said two-dimensional plane and sequentially arranged values on a Y coordinate of said plane.

10. A scan path generation method for arranging a plurality of flip-flops of a logic circuit along a scan path, comprising:
    a) placing said flip-flops on a two-dimensional plane according to original scan path data which represents a sequence according to which said flip-flops would originally be connected in said scan path;
    b) rearranging said flip-flops placed on said two-dimensional plane according to a sequence according to which said flip-flops would be connected in a pattern that meets geometrical design requirements of said logic circuit; and
    c) deriving from said rearranged flip-flops new scan path data representative of a new sequence according to which said flip-flops are to be newly connected in said scan path and replacing said original scan path data with said new scan path data.

11. A scan path generation method for arranging a plurality of flip-flops of a logic circuit along a scan path, comprising:
    a) mapping said flip-flops on an X-Y coordinate plane according to original scan path data which represents a sequence according to which said flip-flops would originally be connected in said scan path;
    b) rearranging said flip-flops placed on said plane according to a map which describes relationships between sequentially arranged values on an X coordinate of said plane and sequentially arranged values on a Y coordinate of said plane, said map meeting geometrical design requirement of said logic circuit; and
    c) deriving from said rearranged flip-flops new scan path data representative of a new sequence according to which said flip-flops are to be newly connected in said scan path and replacing said original scan path data with said new scan path data.

* * * * *